US008901593B2

(12) United States Patent
Fujino (10) Patent No.: US 8,901,593 B2
(45) Date of Patent: Dec. 2, 2014

(54) GRADED FLUORESCENT MATERIAL

(75) Inventor: Shigeru Fujino, Kasuga (JP)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 13/881,144

(22) PCT Filed: Aug. 16, 2012

(86) PCT No.: PCT/US2012/051105
§ 371 (c)(1),
(2), (4) Date: Apr. 23, 2013

(87) PCT Pub. No.: WO2014/028019
PCT Pub. Date: Feb. 20, 2014

(65) Prior Publication Data
US 2014/0048831 A1    Feb. 20, 2014

(51) Int. Cl.
*H01L 33/00* (2010.01)
*C09K 11/08* (2006.01)
*C03C 21/00* (2006.01)
*C03C 4/12* (2006.01)
*C03C 14/00* (2006.01)
*H01L 33/50* (2010.01)

(52) U.S. Cl.
CPC .............. *H01L 33/50* (2013.01); *C03C 21/00* (2013.01); *C03C 4/12* (2013.01); *C03C 14/008* (2013.01); *H01L 33/505* (2013.01); *H01L 33/501* (2013.01)
USPC ...................................... 257/98; 252/301.4 P (58) Field of Classification Search
CPC ..... H01L 33/50; H01L 33/501; H01L 33/508; C03C 21/00; C03C 14/008; C03C 4/12

USPC .............. 257/79, 98, 99; 438/22, 27, 35; 252/301.4, 301, 4 F, 301.4 R, 301.4 P, 252/301.36; 264/21
See application file for complete search history.

(56) References Cited

U.S. PATENT DOCUMENTS

| | | | |
|---|---|---|---|
| 4,112,032 A | 9/1978 | Blaszyk et al. | |
| 5,429,884 A | 7/1995 | Namiki et al. | |
| 5,656,250 A | 8/1997 | Tanaka et al. | |
| 6,340,824 B1 | 1/2002 | Komoto et al. | |
| 7,960,909 B2 * | 6/2011 | Amano et al. | 313/504 |

(Continued)

FOREIGN PATENT DOCUMENTS

WO    WO 2011/004852    1/2011

OTHER PUBLICATIONS

Akai et al., "Fluorescence Glass Fabricated by Phase Separation," Appl. Phys. Lett., 2005, vol. 86.

(Continued)

*Primary Examiner* — Nikolay Yushin
(74) *Attorney, Agent, or Firm* — Knobbe Martens Olson & Bear LLP (57) ABSTRACT

Some embodiments in the present disclosure generally relate to fluorescent structures such as fluorescent glass, fluorescent substrates, and/or light emitting devices, which can include a gradient of fluorescent molecules across the structure, substrate, and/or light emitting device. In some embodiments, the fluorescent glass, fluorescent substrates, and/or light emitting devices can be porous and include at least one fluorescent molecule within the one or more pore. In some embodiments, this can allow for the creation of a gradient fluorescent material throughout the material.

14 Claims, 3 Drawing Sheets

(56) References Cited

U.S. PATENT DOCUMENTS

| | | |
|---|---|---|
| 2003/0136946 A1 | 7/2003 | Kumacheva |
| 2008/0231170 A1* | 9/2008 | Masato et al. ............... 313/501 |
| 2011/0127445 A1 | 6/2011 | Zhang et al. |
| 2012/0107589 A1 | 5/2012 | Fujino et al. |

OTHER PUBLICATIONS

Binnemans, "Lanthanide-Based Luminescent Hybrid Materials," Chem. Rev. 2009, pp. 4283-4374, vol. 109.

Frontier Lighting; information was available at website: http://www.frontierlighting.net/2011/06/rare-earth-metals-shortage-rocks-lighting-world/; in some form no later than Sep. 27, 2011. While the website as it existed on Sep. 27, 2011, is not in Applicant's possession, Applicant has provided a website that was printed on Dec. 27, 2011.

Herino, "Nanocomposite Materials from Porous Silicon," Materials Science and Engineering B, Jan. 14, 2000, pp. 70-76, vol. 69-70.

Ikeda et al., "Preparation of SiO2—PVA Nanocomposite and Monolithic Transparent Silica Glass by Sintering," Journal of Cermaic Society of Japan, 2011, pp. 65-69, vol. 119 (1385).

International Search Report and Written Opinion received in International Application No. PCT/US2012/051105, mailed on Oct. 23, 2012, filed on Aug. 16, 2012.

Li et al., "Synthesis of Highly Luminescent Glasses Incorporating CdTe Nanocrystals through Sol-Gel Processing," Langmuir, 2004, pp. 1-4, vol. 20 (1).

Lumilass from Sumita Optical Glass, Inc.; information was available at website: http://www.sumita-opt.co.jp/ja/products/optical/lumilass.html; in some form no later than Sep. 27, 2011. While the website as it existed on Sep. 27, 2011, is not in Applicant's possession, Applicant has provided a website that was printed on Nov. 6, 2012.

Reisfeld et al., "Optical Properties of Colorants or Luminescent Species in Sol-Gel Glasses," Chemistry and Materials Science, 1992, pp. 207-256, vol. 77.

Suzuki et al., "Formation of a Compatible Composite of Silica/Poly(Vinyl Alcohol) Through the Sol-Gel Process and a Calcinated Product of the Composite," Journal of Materials Science, 1996, pp. 1335-1340, vol. 31 (5).

* cited by examiner

GRADED FLUORESCENT MATERIAL

CLAIM FOR PRIORITY

This application is the US. national phase entry under 35 U.S.C §371 of PCT/US2012/051105, filed Aug. 16, 2012, the entire disclosure of which is hereby incorporated by reference herein.

TECHNICAL FIELD

Embodiments herein generally relate to graded fluorescent substrates.

BACKGROUND

There are a variety of approaches for achieving illumination on a display device or other optical and/or illuminated device. In some situations, people have attempted to obtain uniform illumination by using multiple LEDs, a diffuser, and/or a reflector.

SUMMARY

Some embodiments provided herein relate to a graded fluorescent glass and/or structures. In some embodiments, the fluorescent glass can include silica, at least one pore having a diameter of about 1 nm to about 300 nm, and at least one fluorescent molecule. The fluorescent molecule can be located within the at least one pore. In some embodiments, the fluorescent molecule can include at least one of a transition metal element or a rare earth element.

In some embodiments, a graded fluorescent glass is provided. The glass can include a silica structure including a first surface and a second surface, and wherein the silica structure includes silica, and a gradient of fluorescent molecules. The gradient of fluorescent molecules includes a first concentration of fluorescent molecules at the first surface, and a second concentration of fluorescent molecules at the second surface.

In some embodiments, a light-emitting apparatus is provided that includes at least one light source, and a fluorescent silica glass. The fluorescent silica glass includes silica, at least a first pore and a second pore within the silica, and at least a first fluorescent molecule within the first pore and at least two or more second fluorescent molecules within the second pore.

In some embodiments, a method of manufacturing a fluorescent glass structure is provided. The method can include providing a silica-polyvinyl alcohol composite including a plurality of pores, doping with one or more fluorescent molecules so as to provide a concentration gradient, and sintering the composite, thereby manufacturing a fluorescent glass structure.

In some embodiments, a light-emitting apparatus is provided that includes at least one light source, and a fluorescent silica glass. The fluorescent silica glass can include silica, at least a first pore within the silica, and fluorescent molecules distributed within the silica in a gradient.

The foregoing is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the FIGS., can be arranged, substituted, combined, separated, and designed in a wide variety of different configurations, all of which are explicitly contemplated herein.

In some embodiments, the methods and structures disclosed herein generally relate to fluorescent structures, such as fluorescent glass, substrates, and/or other fluorescent silica related and/or containing structures, that can include a graded distribution of fluorescent molecules contained therein. In some embodiments, the fluorescent glass includes silica, at least one pore (which can be any size, e.g., about 1 nm to about 300 nm), and at least one fluorescent molecule in the pore. In some embodiments, the fluorescent molecule can be located within the at least one pore. Other sections of the fluorescent glass can include greater or lower amounts of the fluorescent molecule, thereby providing a graded fluorescent structure.

Figure 1:
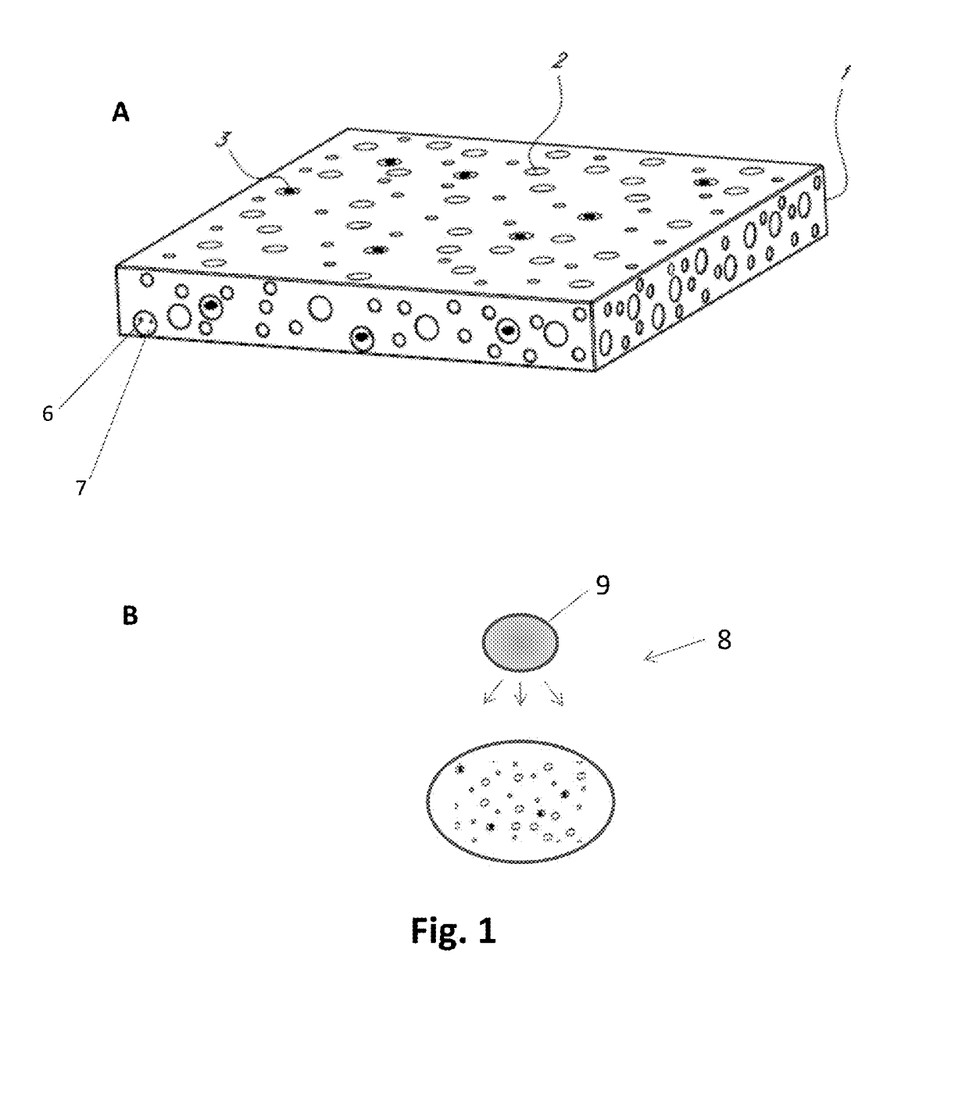
FIG. 1 is a drawing depicting a silica glass structure doped with light-emitting material in accordance with some embodiments. A concentration gradient of the fluorescent molecules within the pores can be present across, between, and/or within various surfaces. This figure can depict embodiments before, during, or after sintering.

FIG. 1 (A) is a drawing depicting some embodiments of a silica-polyvinyl alcohol composite that has been sintered into a fluorescent substrate in which fluorescent molecules can be distributed. The substrate 1 can include a plurality of pores 2. As will be appreciated by one of skill in the art, the substrate can be made from a composite, which before sintering, is a collection of silica particles, the space between which form the voids 2, which can be filled with a polyvinyl alcohol (until the polyvinyl alcohol is removed) and/or additional materials (such as a first type of fluorescent molecule 3, and second types of fluorescent molecules 6 and 7). Once the composite is sintered, it can form the substrate 1 which will include the voids 2, without any significant amount of polyvinyl alcohol remaining. In some embodiments, the silica structure 1 can form at least part of a graded fluorescent glass. (B) In some embodiments, the silica structure 1 can form part of a light-emitting apparatus (8) with at least one light source (9). A gradient of fluorescent molecules can be established in the porous substrate 1 a variety of ways, for example, in some embodiments, a concentration of fluorophores within any single void can be different in one part of the structure from a different part of the structure. In some embodiments, the amount of fluorophore within a void that contains a fluorophore can generally be the same, but more of the voids 2 will have the fluorophore in one section of the structure than in a second section of the structure. In some embodiments, other molecules and/or characteristics can be provided to the structure to further provide a graded aspect of fluorescence to the structure.

In some embodiments, a graded fluorescent glass is provided. The glass can include a silica structure including a first surface and a second surface, and the silica structure can include a) silica, and b) a gradient of fluorescent molecules. The gradient of fluorescent molecules can include a first concentration of fluorescent molecules at the first surface, and a second concentration of fluorescent molecules at the second surface.

In some embodiments, the composite structure (before it is sintered) can be flexible and/or malleable. The composite structure can have sufficient flexibility so that the silica glass structure can be molded into a desired shape, as appropriate for fluorescent uses, including graded fluorescence applications.

In some embodiments, one can further use the composite structure (prior to sintering) to mold and/or form various aspects and/or structures into the surface of the composite so that, once sintered, it will provide a porous glass structure that includes the desired graded aspects, (for example, to provide a light guide or surface of an optical interface with additionally desired optical properties or light guiding aspects via the presence of a specific gradation of fluorescent molecules).

As noted above, various concentrations of fluorescent molecules 3 and/or other light manipulating molecules can be present in the one or more pores 2. Some pores 2 will have a different amount of fluorescent molecule compared to other pores. Thus, in some embodiments, only 0.1, 1, 10, 20, 30, 40, 50, 60, 70, 80, 90, or 99% of the pores will include a fluorescent molecule, such that the absence of the fluorescent molecule in the remaining pores provides a concentration gradient. In some embodiments, all of the pores contain some fluorescent molecule, but the amount of fluorescent molecule in each pore (or across various populations of pores) varies so that a concentration gradient is provided. In some embodiments, 1, 2, 3, 4, 5, 10, 20, 30, 40, 50, 60, 70, 80, 90, 95, 98, 99, or 100% of the pores include at least some amount of the fluorescent molecule, including any range below any one of the preceding values and any range between any two of the preceding values. In some embodiments, at least one of the preceding percents of pores can contain some amount of the fluorescent molecule, e.g., at least some portion of the inner surface of the pore being coated (e.g. 0.1, 1, 2, 3, 4, 5, 6, 7, 8, 9, 10, 20, 30, 40, 50, 60, 70, 80, 90, 95, 98, 99, or 100% of the surface of the pore being coated, including any range below any one of the preceding values and any range between any two of the preceding values), to at least some percent of the volume of the pore being occupied by the fluorescent molecule (e.g., 0.001, 0.01, 0.1, 1, 2, 3, 4, 5, 6, 7, 8, 9, 10, 20, 30, 40, 50, 60, 70, 80, 90, 95, 98, 99, or 100% of the volume of the pore being occupied by the fluorescent molecule, including any range below any one of the preceding values and any range between any two of the preceding values). In some embodiments, while the fluorescent molecule can be in solution when added to the composite or structure, in the final product, the fluorescent molecule can be dried. In some embodiments, the fluorescent molecule is contained in the pore as a gas. In some embodiments, the fluorescent molecule is contained in the pore as a liquid. In some embodiments, the fluorescent molecule is contained in the pore as a solid. In some embodiments, the fluorescent molecule may be contained in the pore as a plasma.

In some embodiments, the plurality of pores 2 can have an average diameter of about 2 nm to about 100 nm. In some embodiments, the plurality of pores 2 can have an average diameter of about 3 nm to about 30 nm. In some embodiments, the pores can have an average diameter of about 1 nm to about 500 nm, e.g., 1, 2, 3, 4, 5, 10, 20, 30, 40, 50, 60, 70, 80, 90, 100, 200, 300, 400, or 500 nm, including any range below any one of the preceding values and any range between any two of the preceding values. In some embodiments, the size of the pores can change across and/or through a structure. In such embodiments, the amount of fluorescent molecule that can be trapped in each pore can depend upon the size of the pore, thus, more or less of the fluorescent molecule can be contained within various sections of the structure in such a manner, providing for another way in which a concentration gradient of the fluorescent molecules can be provided for.

The fluorescent molecule 3, 6 and 7 can include, but is not limited to, at least one of a transition metal or a rare earth elements (e.g., Y, Sc, La, Ce, Pr, Nd, Pm, Sm, Eu, Gd, Tb, Dy, Ho, Er, Tm, Yb, and/or Lu). In some embodiments, the molecules need not be fluorescent and can be reflective and/or absorbing. In some embodiments, the molecules manipulate light and/or have an optical property. In some embodiments, the molecules can be an inorganic fluorescent substance. In some embodiments, if the molecule is added prior to sintering, any molecule can be used as long as it is not excessively sensitive to heat (for example, it does not lose its fluorescent property at more than 1000 degrees Centigrade). In some embodiments, the fluorescent molecule is capable of diffusion into the one or more pores and can be fluorescent when dried.

In some embodiments, a single type of fluorescent molecule is used in the structure. In some embodiments, multiple types of fluorescent molecules are used in the structure, for example, 2, 3, 4, 5, 6, 7, 8, 9, 10, 15, 20, 30, 40, 50, or 100 types of fluorescent molecules can be used, including any range above any one of the previous values and any range between any two of the previous values. In some embodiments, each fluorescent molecule has its own concentration gradient. In some embodiments, the concentration gradient is only present for a subset of the fluorescent molecules. In some embodiments, different fluorescent molecules have different concentrations gradients. In some embodiments, the concentration of fluorescent molecules as a whole may be consistent throughout a structure, but there can be concentration gradients of various particular fluorescent molecules within the structure and/or surface. For example, on a first side of a plate substrate, there can be a high concentration of blue fluorescent molecules that then linearly decreases to zero as one passes through the plate to the opposite (and second) side of the plate. On the second side of the plate, there can be a high concentration of red fluorescent molecules that linearly decreases in concentration to zero as one passes through the plate to the opposite (and first) side of the plate. Thus, at any given depth of the plate, the total amount of fluorescent molecules is the same, but the amount of red or blue fluorescent molecule can be different. In some embodiments, when numerous fluorescent molecules are employed, different molecules are positioned in different locations on the structure, thus, there can be for example, at least 1, 2, 3, 4, 5, 6, 7, 8, 9, 10, 15, 20, 30, 40, 50, 100, or more different locations, each with a different type of fluorescent molecule. In some embodiments, (for example, when a single type of fluorescent molecule is employed), the single type of fluorescent molecule is positioned in different locations on the structure. In some embodiments, different types of fluorescent molecules can be located at different locations. In some embodiments, each of the different locations can be a same shape. In some embodiments, each of the different locations can be a different shape. In some embodiments, any shape and/or pattern can be employed. In some embodiments, the fluorescent molecules are distributed throughout an entire surface area of the substrate and/or structure. In some embodiments, the fluorescent molecules are distributed in a generally circular pattern, on a surface of the substrate. In some embodiments, the fluorescent molecules are distributed in a generally semispherical pattern into the depth of the substrate. In some embodiments, the fluorescent molecules are distributed so as to help redirect and/or distribute a point source of light that is to be, or is, positioned on a side of the substrate. In some embodiments, the fluorescent molecules are distributed on a surface of the substrate so as to be positioned so as to act as a filter for a light source that is to be (or is) associated with the substrate.

In some embodiments, the fluorescent molecules 3, 6 and 7 can be doped into the silica glass substrate 1 by impregnating the fluorescent molecule 3 in the silica glass substrate 1 so that the fluorescent molecule 3 can enter into one of the pores 2. In some embodiments, the fluorescent molecule can be added to the initial composition (prior to sintering), but after the formation of the polyvinyl alcohol-silica composite. In some embodiments, the fluorescent molecule can be added to the initial composition (prior to sintering), before the creation of the polyvinyl alcohol-silica composite. In some embodiments, the fluorescent molecule can be added to the final structure (after the sintering), and the pores help retain the fluorescent material and/or keep a volume and/or amount of the fluorescent material safe from the surface of the substrate. In some embodiments, the PVA-Silica composite can be formed using the method described in U.S. Pat. Publication 2012/0107589.

In some embodiments, the presence of pores in a starting and/or final structure can result in a graded product (for example, a fluorescent glass and/or other fluorescent silica related structure that has a graded concentration of the fluorescent molecules). In some embodiments, the graded fluorescent structure can include a silica structure with a first surface and a second surface, where the gradient of fluorescent molecules can include a first concentration of fluorescent molecules at the first surface and a second concentration of fluorescent molecules at the second surface.

Figure 2:
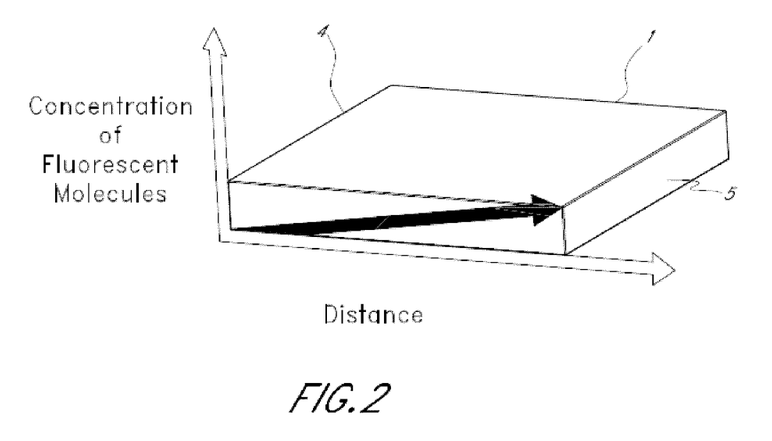
FIG. 2 is a graph depicting some embodiments involving the concentration of fluorescent molecules across the length, depth, and/or surface of a silica glass structure.

FIG. 2 is a graph depicting some embodiments in which there is a concentration gradient of fluorescent molecules across a thickness of a structure. The substrate 1 can include a plurality of pores as shown in FIG. 1 (and can be in either the composite form or the sintered form). As illustrated in FIG. 2, the silica glass substrate 1 can include a first surface 4 at one side and a second surface 5 on a different side. In some embodiments, a concentration of fluorescent molecules at a first surface 4 is different from a concentration of fluorescent molecules at a second surface 5. In some embodiments, the first and second surfaces are on opposite sides. In some embodiments, the first and second surfaces are on a same side and are just different parts of the same side (for example, where a doping material is applied to only a subpart of a surface and allowed to diffuse out through that surface). In some embodiments, the first and second surfaces are on adjacent sides.

In order to display this gradient, FIG. 2 includes a graphical representation overlaying the depicted substrate to illustrate some embodiments of possible concentration gradients of fluorescent molecules along the y-axis as a function of distance along the x-axis. Thus, in some embodiments, the silica structure 1 can include silica and a gradient of fluorescent molecules. In some embodiments, the gradient of fluorescent molecules can include a first concentration of fluorescent molecules at the first surface 4, and a second concentration of fluorescent molecules at the second surface 5. In some embodiments, the concentration of the fluorescent molecules at the first and/or second surface can be from about 1 ppm to about 1,000,000 ppm, for example, 1, 10, 100, 1000, 10,000, 50,000, 100,000, or 1,000,000 ppm, including any range between any two of these values and any range above or below these values.

In some embodiments, as illustrated in FIG. 2, the gradient of fluorescent molecules can include an approximately linear change in concentration from the first surface 4 to the second surface 5. In some embodiments, the gradient is non-liner. In some embodiments, the gradient is exponential. In some embodiments, the gradient is the result of suspended fluorescent molecules being allowed to permeate the sintered structure. In some embodiments, the gradient is a difference of at least 0.01% between the two surfaces, e.g., 0.01, 0.1, 1, 2, 3, 4, 5, 10, 15, 20, 30, 40, 50, 60, 70, 80, 90, 100, 200, 300, 500, 1000, 10,000% or more, including any range above any one of the previous values and any range between any two of the previous values. In some embodiments, the gradient can be across a thickness of the structure. In some embodiments, the gradient can be across a width of the structure. In some embodiments, the gradient can be across a thickness and a width of the structure. In some embodiments, the gradient can be across a length of the structure. In some embodiments, the gradient can be across at least one of a thickness, a length, and/or a width of the structure. In some embodiments, there can be two or more surfaces between which the gradient is established, for example 2, 5, 10, 100 or more surfaces including any range above any one of the previous values and any range between any two of the previous values. In some embodiments, there is more than one gradient, for example, 2, 3, 4, 5, 10, 20, 30, 50, or 100 or more gradients between two or more surfaces including any range above any one of the previous values and any range between any two of the previous values.

In some embodiments, the silica glass structure 1 can form part of a light-emitting apparatus that can include a fluorescent structure that is graded. The light-emitting apparatus can include at least one light source. In some embodiments, the light source can include, but is not limited to, a light-emitting diode (LED), an incandescent light bulb, a laser, a fluorescent tube, or any other form of a light source. In some embodiments, the gradient of the fluorescent molecules, structure and/or location of the fluorescent molecules allows one to filter, redirect, focus, shade, or otherwise manipulate light passing through the structure. In some embodiments, a point source of light can be made more pleasant and/or diffuse, by the use of a substrate having a concentration gradient of fluorescent molecules. In some embodiments, a wavelength and/or other optical property of light from a light source can be effectively manipulated through the presence of the concentration gradient of fluorescent molecules in the substrate, allowing for changes in wavelength and/or other optical properties by the fluorescent molecule(s) and/or concentration gradient(s).

In some embodiments, a light-emitting apparatus is provided that includes at least one light source, and a fluorescent silica glass. The fluorescent silica glass includes silica, at least a first pore and a second pore within the silica, and at least a first fluorescent molecule within the first pore and at least two or more second fluorescent molecules within the second pore, thereby establishing a gradient between the two pores.

In some embodiments, a light-emitting apparatus is provided that includes at least one light source, and a fluorescent silica glass. The fluorescent silica glass can include silica, at least a first pore within the silica, and fluorescent molecules distributed within the silica in a gradient.

In some embodiments, the light-emitting apparatus can also include a fluorescent silica glass or silica glass structure. The fluorescent silica glass can include silica, at least a first pore and a second pore within the silica, and at least a first fluorescent molecule within the first pore, and a second fluorescent molecule within the second pore. A concentration gradient can be present between and/or by the two pores.

In some embodiments, the first molecule absorbs radiation at a first wavelength of light, and the second fluorescent molecule absorbs radiation at a second wavelength of light. In some embodiments, the first wavelength and the second wavelength are different. In some embodiments, the molecules absorb at least one UV, visible, and/or IR wavelength of light.

In some embodiments, the first molecule emits radiation at a first wavelength of light, and the second fluorescent molecule emits radiation at a second wavelength of light. The first wavelength and the second wavelength can be different. In such an embodiment, the silica glass structure 1 can be configured to produce different colors for a display. In some embodiments, the molecules emit radiation at, at least one UV, visible, and/or IR wavelength of light. In other embodiments, the molecules emit radiation at two or more wavelengths of light.

In some embodiments, the first fluorescent molecule can be a fluorescent element. In some embodiments, the first molecule and the second molecule can be the same type of fluorescent molecule. In some embodiments, the first molecule and the second molecule can be different types of fluorescent molecules. As such, different gradients can be present in the same substrate.

In some embodiments, the light source and the fluorescent silica glass can be components of a diode or a cold cathode fluorescent lamp. The diode or the cold cathode fluorescent lamp can be part of an illumination system for illuminating a display device. In some embodiments, the glass, substrate, structure, or other porous structure can be positioned in front of and/or immediately adjacent to a source of light. In some embodiments the glass, substrate, structure, or other porous structure can be, or be used as a filter and/or diffuser. A graded distribution of fluorescent molecules can allow for the intensity of light from the lamp to be appropriately distributed and/or diffused.

In some embodiments, a number of fluorescent molecules present within the first pore is different from a number of fluorescent molecules present within the second pore. In some embodiments, the first pore can be located at a first location in the fluorescent silica glass 1 and the second pore can be located at a second location in the fluorescent silica glass 1. In some embodiments, the light-emitting apparatus can further include a concentration gradient of fluorescent molecules from the first location to the second location. The fluorescent molecules can be dispersed non-uniformly throughout the fluorescent silica 1. The fluorescent intensity of the light-emitting apparatus can vary across the length of the fluorescent silica glass 1. In some embodiments, a fluorescent gradient can exist because of a difference in the number of pores, the size of the pores, and/or the amount of fluorescent material within the pores.

In some embodiments, the first location can be at a first surface 4 of the fluorescent silica glass 1, and the second location can be closer to the light source relative to the first surface 4. In some embodiments, the first location can at least partially surround the second location.

Figure 3:
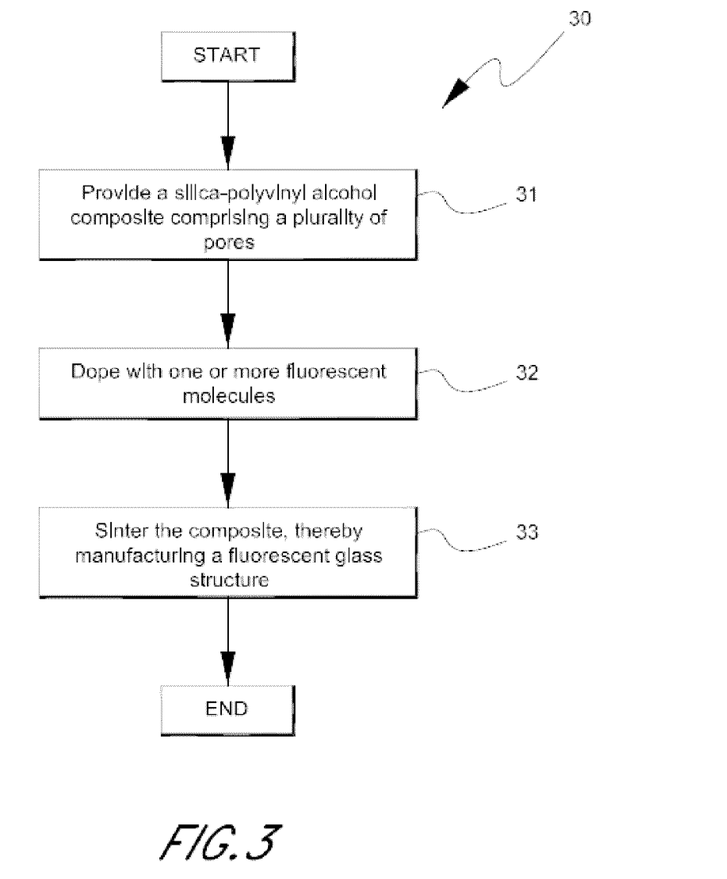
FIG. 3 is a flow chart of some embodiments of a method of manufacturing a fluorescent glass structure.

FIG. 3 is a flow chart of some embodiments of a method of manufacturing a fluorescent glass structure. In some embodiments, the process 30 can involve providing a silica-polyvinyl alcohol composite that has a plurality of pores (block 31). In some embodiments, the process 30 further involves doping with one or more fluorescent molecules (block 32). In some embodiments, the process 30 further involves sintering, thereby manufacturing a fluorescent structure (block 33). In some embodiments, the fluorescent structure can be the fluorescent glass structure described earlier herein with reference to FIG. 1 and FIG. 2. The doping (or a subsequent process) allows for one to create a concentration gradient of one or more fluorescent molecules across and/or within a surface and/or surfaces.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

In some embodiments, the method can include providing a silica-polyvinyl alcohol composite including a plurality of pores, doping the composite with one or more fluorescent molecules so as to provide a concentration gradient, and sintering, thereby manufacturing a fluorescent glass structure.

In some embodiments, the process of doping can be performed before sintering. In some embodiments, the process of doping can be performed after sintering. In some embodiments, doping can include contacting a solution of the one or more fluorescent molecules with the composite so as to allow the one or more fluorescent molecules to enter at least one pore of the plurality of pores. The concentration of the one or more fluorescent molecules in the solution can correspond and/or determine to the doping concentration in the fluorescent glass structure, depending upon the location of the pore within the glass structure and the amount of time that the glass structure is doped. In some embodiments, the concentration and/or amount of fluorescent molecule within the pore(s) can depend upon the amount of time that the doping was allowed to occur. In situations where a gradient is to occur, one can allow doping to occur for a period of time such that the desired concentration gradient is established by the doping process itself (as the material diffuses and/or soaks into the substrate and/or composite). In some embodiments, the concentration gradient can be established by a wash out process. For example, if doping saturates the pores across both surfaces (such that there is no gradient), then a wash or rinse solution can be applied to one of the surfaces, allowing for a decrease in the concentration of the fluorescent molecules at that surface, thereby establishing a concentration gradient. In some embodiments, the wash and/or rinse can include a second or different type of fluorescent molecule, such that the addition of the second fluorescent molecule can establish a concentration gradient in a previously uniformly distributed fluorescent molecule.

In some embodiments, the method of manufacturing the fluorescent silica glass can further include forming a non-uniform distribution of fluorescent molecules across the fluorescent glass structure by controlling an amount of time during which the doping occurs. In some embodiments, the non-uniform distribution can include any of the gradients discussed herein. In some embodiments, the amount of time during which doping occurs can correspond to the amount of fluorescence and/or degree of gradient that is present in the fluorescent glass structure. A gradient can be set up between opposite sides of a substrate; however, when the doping only occurs for a brief period of time, the gradient need not go all the way across the substrate, as the fluorescent molecules may only have traveled partially across the substrate. In some embodiments, a gradient can be established or controlled by controlling the speed of immersion of the material into the solution and/or the speed of pulling the material out from the solution.

In some embodiments, the process of making the initial composite silica-polyvinyl alcohol can involve providing a silicon dioxide suspension of fumed silica. In some embodiments, the process further involves combining a polyvinyl alcohol aqueous solution with the silicon dioxide suspension to form a mixture. In some embodiments, the process further involves drying the mixture to obtain a porous silica-polyvinyl alcohol composite structure. As noted above, in some embodiments, the fluorescent molecule can be added before, during, or after the creation of the porous silica-polyvinyl alcohol composite is formed.

In some embodiments, the method of manufacturing the silica-polyvinyl alcohol composite can further include adjusting the pH of the mixture during the process (preferably to keep it between about 2 and about 4. In some embodiments, combining the polyvinyl alcohol aqueous solution with the silicon dioxide particles can include stirring the mixture at about room temperature. In some embodiments, the mixture can be stirred with a magnetic stirrer for 2, 3, 5, 8, 10, 12, 15, 20, or 24 hours (including any range beneath any one of the preceding values and any range defined between any two of the preceding values). In some embodiments, the mixture can be stirred at 200, 300, 500, 800, 1000, 1200, or 1500 rpm, including any range beneath any one of the preceding values and any range defined between any two of the preceding values. For example, in some embodiments, the mixture can be stirred with a magnetic stirrer for 12 hours at 800 rpm. In some embodiments, drying the mixture can include subjecting the mixture to 10° C., 15° C., 25° C., 30° C., 35° C., 45° C., 55° C., 65° C., 75° C., or room temperature in air (including any range beneath any one of the preceding values and any range defined between any two of the preceding values). For example, drying the mixture can include drying the mixture at 30° C. in air. In some embodiments, the composite can be dried adequately so that the composite can be manipulated as desired (such as a pattern stamped into it or a shape molded out of it). In some embodiments, the composite can be dried for 0.1, 0.5, 1, 2, 3, 4, 5, 6, 7, 8, 9, 10, 12, or 24 hours, including any range below any of the preceding values and any range defined between any two of the preceding values.

In some embodiments, the silica particle or particles (e.g., in the composite, prior to sintering) can have an average diameter that is less than 100 nm. In some embodiments, the average diameter of the at least one silica particle can be about 5 nm to about 50 nm. In some embodiments, the average diameter of the at least one silica particle can be about 3 nm to about 10 nm. In some embodiments, the average diameter of the at least one silica particle can be about 1 nm to about 50 nm. In some embodiments, the average diameter of the at least one silica particle can be about 7 nm. In some embodiments, the average diameter of the silica particles can be below 200 nm, e.g., 200, 190, 180, 150, 100, 90, 80, 70, 60, 50, 40, 30, 20, 10 or 1 nm, including any range below any one of the preceding values and any range between any two of the preceding values.

In some embodiments, the graded fluorescent structure can be formed from a composite of at least one silica particle combined with polyvinyl alcohol. In some embodiments, the composite can include at least twice as much silica as polyvinyl alcohol, by weight. In some embodiments, the weight ratio of the silica to polyvinyl alcohol is about 80:20. In some embodiments, the composite can include at least as much silica as polyvinyl alcohol, by weight, e.g., 1:1, 2:1, 3:1, 4:1, 5:1, 6:1, 7:1, 8:1, 9:1, 10:1, or 100:1 including any range above any one of the preceding values and any range between any two of the preceding values. In some embodiments, the silica-polyvinyl alcohol composite can include an organic/inorganic interface.

In some embodiments, following drying the mixture to obtain a silicon-dioxide polyvinyl alcohol composite, the silicon dioxide-polyvinyl alcohol composite is then heated to yield a porous silica glass. The fluorescent molecules can then be added to the silica glass to produce a graded fluorescent silica glass.

In some embodiments, the method of manufacturing the porous silica glass can further include shaping the silicon dioxide-polyvinyl alcohol composite into a desired shape, prior to the heating process that yields the porous silica glass (the sintering process). In this pre-sintered state, the silicon dioxide-polyvinyl alcohol composite can be sufficient flexibility to be moldable into the desired shape. The fluorescent gradient can be applied before, during, and/or after this process. In some embodiments, one can initially shape the composite and use the shape to allow doping in a desired pattern to obtain a desired shape of a concentration gradient and/or amount of concentration gradient. For example, a physical peak can be created in the malleable composite, and only the peak can be exposed to the doping solution—thereby resulting in a concentration gradient from the peak and down into the composite material that forms the peak. The composite can then be reshaped (for example flattened), prior to sintering, thereby providing a different shape and/or concentration gradient than one would have had, had one simply exposed the entire front surface of a composite.

In some embodiments, prior to sintering, one allows the silica-polyvinyl alcohol composite to dry to some extent. In some embodiments, the method of manufacturing the porous silica glass can further include adding a fluorescent molecule (and/or other material) to at least one pore, either before the drying process or after. In some embodiments, the fluorescent molecule can be added to the silicon dioxide-polyvinyl alcohol composite. For example, the fluorescent molecule can be fixed and adsorbed onto a surface in the pore in the silicon dioxide-polyvinyl alcohol composite.

In some embodiments, the porous silica composite is dried at least partially, just prior to molding and/or manipulation, e.g., 1, 2, 5, 10, 15, 20, 30, 40, 50, 60, 70, 80 90, 95, or 99% of the moisture can be removed (including any range above any one of the preceding values and any range between any two of the preceding values). In some embodiments, this moisture removal is performed after molding, and/or during molding. In some embodiments, sufficient moisture is removed so as to maintain a desired concentration gradient. In some embodiments, a separate solvent (one that can dissolve the fluorescent molecule) can be added back, to further refine and/or manipulate the fluorescent gradient. For example, while a generally decreasing gradient can be established from a first side to a second side by exposing the first side to the doping material, subsequently exposing the first side to a wash solution can remove some of the fluorescent molecules from the first side, allowing one to create a concentration gradient where the highest concentration is between the two surfaces, rather than simply at one of the two surfaces.

In some embodiments, the ratio of fluorescent molecule to $SiO_2$, by weight (in the initial mixture, dried composite, and/or final structure), can be 1:10, 1:100, 1:1000, 1:10000, 1:50,000, 1:100,000, or 1:1,000,000, including any range beneath any one of the preceding values and any range between any two of these values. Of course, where the concentration gradient goes to zero, no fluorescent molecule need be present.

In some embodiments, the method of manufacturing the structure can further include heating the composite to produce a transparent silica glass. For example, heating the composite can include heating the composite from room temperature to an adequate temperature, e.g., 500, 600, 700, 800, or 900° C. or more. In some embodiments, one transitions from the temperature at which the molding and/or addition of the fluorescent molecule occurred (e.g., around room temperature) to the heating and/or drying temperature at a desired rate so as to avoid issues of drying and/or rapid vapor formation. In some embodiments, the rate of increase can be from 1 to 10° C./minute, e.g., 1, 2, 3, 4, 5, 6, 7, 8, 9 or 10° C./minute. In some embodiments, there can be two phases of heating. In some embodiments, the first occurs at a temperature range from 300 to 900° C. for 30 minutes to 24 hours (e.g., room temperature, 40, 50, 60, 70, 100, 200, 300, 400, 500, 600, 700, 800, 900° C. over 0.5, 1, 2, 3, 4, 5, 6, 7, 8, 9, 10, 11, 12, 13, 14, 15, 16, 17, 18, 19, 20, 21, 22, 23, or 24 hours, including any range between any two of the temperatures and any two of the hours and any range above any one of the temperatures and one of the listed hours. In some embodiments, a sintering process can be performed to yield a silica substrate. In some embodiments this phase of heating occurs at a temperature range from room temperature to 1700° C. for 30 minutes to 24 hours (e.g., 30, 40, 50, 60, 70, 100, 200, 300, 400, 500, 600, 700, 800, 900, 1000, 1100, 1200, 1300, 1400, 1500, 1600, or 1700° C. over 0.5, 1, 2, 3, 4, 5, 6, 7, 8, 9, 10, 11, 12, 13, 14, 15, 16, 17, 18, 19, 20, 21, 22, 23, or 24 hours, including any range between any two of the temperatures and any two of the hours and any range above any one of the temperatures and one of the listed hours. In some embodiments, the nanocomposite material can exhibit transparency when sintered at or above 1000° C. Thus, in some embodiments, the substrate can be transparent. In some embodiments, the transparency can be from the vacuum ultraviolet range to the infrared range. In some embodiments, a sintering temperature of less than 1000° C. can be used, which, in some embodiments, can provide different optical properties for the provided substrate.

In some embodiments, once the material is molded it can then be subjected to heat treatment at 600° C. for about three hours, then a heating process raising the temperature from 600° C. to 1100° C., and then the material can be subjected to a heat treatment of 1100° C. for about three hours. When the fluorescent molecules are administered after the sintering, there can be a second drying process to remove and/or reduce any solvent used to carry the fluorescent molecules into the pores. In some embodiments, the fluorescent molecules can be applied as a liquid. In some embodiments, the fluorescent molecules can be applied as a gas. In some embodiments, the fluorescent molecules can be applied as a plasma.

EXAMPLES

Example 1

Method of Making a Porous Silica Substrate

The porous silica substrate can be prepared as generally outlined in U.S. Pat. Pub. 2012/0107589. A polyvinyl alcohol solution is added to a $SiO_2$ suspension of fumed silica having an average primary particle diameter of 7 nm to give a $SiO_2$: polyvinyl alcohol weight ratio of 80:20. The pH is adjusted and the solution is stirred with a magnetic stirrer for 12 hours at 800 rpm in air at room temperature, yielding a $SiO_2$-polyvinyl alcohol aqueous solution. This is then put into a desired mold and will be dried at 30 degrees Centigrade in air to yield a $SiO_2$-polyvinyl alcohol composite. The nanocomposite has pores on the order of several nanometers to several tens of nanometers.

A solution containing a fluorescent transition metal element is used to dope the $SiO_2$-polyvinyl alcohol composite. The fluorescent transition metal element is present at a concentration of 50 ppm. The fluorescent transition metal enters the pores of the composite. The doping is allowed to continue only until the point at which a desired gradient is set up across the depth of the substrate, such that there is a greater concentration of the fluorescent transition metal at a first surface of the material, and a lower concentration of the fluorescent transition metal at a second surface of the material.

The composite material is dried at 30 degrees Centigrade so as to reduce any additional liquid present from the addition of the fluorescent transition metal solution. The material can then be heated to 600 degrees Centigrade (increasing from room temperature at a rate of 5 degrees Centigrade per minute), for three hours. The material is then heated at 1000 degrees Centigrade for three hours, thereby providing a transparent silica glass with a graded amount of the fluorescent molecules in the pores of the substrate.

Example 2

Method of Making a Fluorescent Light Casing

A polyvinyl alcohol solution is added to a $SiO_2$ suspension of fumed silica having an average primary particle diameter of 7 nm to give a $SiO_2$:polyvinyl alcohol weight ratio of 80:20. The pH is adjusted and the solution is stirred with a magnetic stirrer for 12 hours at 800 rpm in air at room temperature, yielding a $SiO_2$-polyvinyl alcohol aqueous solution. This is then put into a desired mold and will be dried at 30 degrees Centigrade in air to yield a $SiO_2$-polyvinyl alcohol composite. The nanocomposite has pores on the order of several nanometers to several tens of nanometers. The nanocomposite material is provided as a starting material. At least a part of the material is shaped into a desired section for a cover of an LED light. The material is heated at 1000 degrees Centigrade for three hours, thereby providing a transparent silica glass with pores.

A solution containing a fluorescent rare earth element is used to dope the transparent silica glass at a specific location in the shaped starting material, based upon the positioning of the cover when in place as a LED. The fluorescent rare earth element is present at a concentration of 10,000 ppm. The fluorescent transition metal enters the pores of the silica glass. The doping is allowed to continue only until the point at which a desired gradient is set up across the surface of the substrate such that the entire surface is not doped as heavily as the section to be placed immediately over the LED.

The excess solution of the rate earth element is removed and the glass is dried at 30 degrees Centigrade so as to reduce any additional liquid present from the addition of the fluorescent transition metal solution, thereby providing a graded amount of the fluorescent molecules in the pores of the substrate.

Example 3

Method of Making a Fluorescent Substrate

A polyvinyl alcohol solution is added to a $SiO_2$ suspension of fumed silica having an average primary particle diameter of 7 nm to give a $SiO_2$:polyvinyl alcohol weight ratio of 80:20. The pH is adjusted and the solution is stirred with a magnetic stirrer for 12 hours at 800 rpm in air at room temperature, yielding a $SiO_2$-polyvinyl alcohol aqueous solution. This is then put into a desired mold and will be dried at 25 degrees Centigrade in air to yield a $SiO_2$-polyvinyl alcohol composite. The nanocomposite has pores on the order of several nanometers to several tens of nanometers. The nanocomposite material is heated to 700 degrees Centigrade (increasing from room temperature at a rate of 5 degrees Centigrade per minute), for three hours. The material is then heated at 1000 degrees Centigrade for three hours, thereby providing a transparent silica glass with pores.

A solution containing a fluorescent molecule is used to dope a first side of the porous silica glass. Only the surface of the first side is contacted to the solution, and only long enough to allow some of the fluorescent molecules and solution to enter into the partially opened pores on the surface of the silica glass, without having the solution wicked all the way to the opposite side of the silica glass, thereby setting up a gradient across the glass. The fluorescent molecule is present at a concentration of 500 ppm on the first side. The glass is then removed from the solution and glass is allowed to dry, thereby drying at least some of the fluorescent molecules inside some of the pores in the glass.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, compositions or systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A light-emitting apparatus comprising:
   at least one light source; and
   a fluorescent silica glass, wherein the fluorescent silica glass comprises:
      silica;
      at least a first pore within the silica and a second pore within the silica; and
      at least a first type of fluorescent molecule within the first pore and at least two or more types of second fluorescent molecules within the second pore.

2. The light-emitting apparatus of claim 1, wherein the first type of fluorescent molecules is a different type of fluorescent molecules from the second fluorescent molecule.

3. The light-emitting apparatus of claim 1, wherein the light source and the fluorescent silica glass are components of a diode or a cold cathode fluorescent lamp.

4. The light-emitting apparatus of claim 1, wherein: the first type of fluorescent molecule absorbs radiation at a first wavelength of light, the second fluorescent molecule absorb radiation at a second wavelength of light, and the first wavelength and the second wavelength are different.

5. The light-emitting apparatus of claim 4, wherein the first type of fluorescent molecule emits radiation at a first wavelength of light, the second fluorescent molecules emits radiation at a second wavelength of light, and the first wavelength and the second wavelength are different.

6. The light-emitting apparatus of claim 5, wherein the first type of fluorescent molecule comprises a fluorescent element.

7. The light-emitting apparatus of claim 6, wherein the fluorescent element comprises at least a transition metal element or a rare earth element.

8. The light-emitting apparatus of claim 1, wherein a number of types of fluorescent molecules present within the first pore is different from a number of types of fluorescent molecules present within the second pore.

9. The light-emitting apparatus of claim 8, wherein the first pore is located at a first location in the fluorescent silica glass and wherein the second pore is located at a second location in the fluorescent silica glass.

10. The light-emitting apparatus of claim 9, further comprising a concentration gradient of fluorescent molecules from the first location to the second location.

11. The light-emitting apparatus of claim 10, wherein the concentration gradient is approximately linear.

12. The light-emitting apparatus of claim 10, wherein the first location is at a first surface of the fluorescent silica glass, and wherein the second location is closer to the light source, relative to the first surface.

13. The light-emitting apparatus of claim 10, wherein the first location and the second location are at a first surface of the fluorescent silica glass.

14. The light-emitting apparatus of claim 13, wherein the first location at least partially surrounds the second location.

* * * * *